US011545647B2

(12) United States Patent
Kajimoto

(10) Patent No.: US 11,545,647 B2
(45) Date of Patent: Jan. 3, 2023

(54) LIGHT-EMITTING APPARATUS HAVING A GROOVE IN THE INSULATING LAYER BETWEEN THE LIGHT-EMITTING REGION AND AN END OF THE INSULATING LAYER

(71) Applicant: CANON KABUSHIKI KAISHA, Tokyo (JP)

(72) Inventor: Norifumi Kajimoto, Zama (JP)

(73) Assignee: CANON KABUSHIKI KAISHA, Tokyo (JP)

(*) Notice: Subject to any disclaimer, the term of this patent is extended or adjusted under 35 U.S.C. 154(b) by 0 days.

(21) Appl. No.: 17/005,711

(22) Filed: Aug. 28, 2020

(65) Prior Publication Data
US 2021/0074951 A1 Mar. 11, 2021

(30) Foreign Application Priority Data
Sep. 6, 2019 (JP) .............................. JP2019-163275

(51) Int. Cl.
H01L 27/15 (2006.01)
H01L 51/52 (2006.01)
H01L 27/32 (2006.01)
H01L 51/56 (2006.01)

(52) U.S. Cl.
CPC ...... H01L 51/5253 (2013.01); H01L 27/3225 (2013.01); H01L 51/56 (2013.01); H01L 2251/303 (2013.01)

(58) Field of Classification Search
CPC .............................. H01L 51/5253; H01L 27/15
See application file for complete search history.

(56) References Cited

U.S. PATENT DOCUMENTS

| 7,671,532 | B2 | 3/2010 | Kim |
| 11,374,200 | B2 * | 6/2022 | Seon ................... H01L 51/0096 |
| 2010/0214389 | A1 * | 8/2010 | Ito ............................ B41J 2/451 |
| | | | 347/238 |
| 2015/0062963 | A1 * | 3/2015 | Meir ................. G02F 1/133602 |
| | | | 362/607 |
| 2015/0155520 | A1 * | 6/2015 | Kim .................... H01L 27/3276 |
| | | | 257/40 |
| 2017/0012243 | A1 * | 1/2017 | Suzuki .................. H01L 51/525 |
| 2018/0182812 | A1 * | 6/2018 | Heo ...................... H01L 51/442 |
| 2018/0219176 | A1 | 8/2018 | Kim et al. |
| 2020/0091459 | A1 | 3/2020 | Senoo et al. |
| 2020/0286948 | A1 * | 9/2020 | Qin ..................... H01L 27/3246 |

FOREIGN PATENT DOCUMENTS

| CN | 110137375 A | 8/2019 |
| JP | 2006-120635 A | 5/2006 |
| WO | 2018/179047 A1 | 10/2018 |

OTHER PUBLICATIONS

Extended European Search Report in European Application No. 20190419.0 (dated Feb. 2020).

* cited by examiner

Primary Examiner — Caleb E Henry
(74) Attorney, Agent, or Firm — Venable LLP

(57) ABSTRACT

A light-emitting apparatus includes an insulating layer including a light-emitting region including a light-emitting element, and a groove provided in the insulating layer. The groove is provided in a portion between the light-emitting region and an end of the insulating layer, and has a zigzag pattern or a wrapping pattern.

21 Claims, 12 Drawing Sheets

LIGHT-EMITTING APPARATUS HAVING A GROOVE IN THE INSULATING LAYER BETWEEN THE LIGHT-EMITTING REGION AND AN END OF THE INSULATING LAYER

BACKGROUND OF THE INVENTION

Field of the Invention

The present invention relates to a light-emitting apparatus, a manufacturing method thereof, a printer, a display apparatus, a photoelectric conversion apparatus, electronic equipment, an illumination apparatus, and a mobile body.

Description of the Related Art

A light-emitting apparatus using an organic EL (Electro-Luminescence) element is known as an exposure light source for a printer. It is known that the characteristics of the organic EL element are deteriorated by moisture. Therefore, various techniques for improving the moisture resistance of the organic EL element have been provided. In the light-emitting apparatus described in Japanese Patent Laid-Open No. 2006-120635, pixels formed on the substrate are sealed by a passivation film. A groove is formed between the light-emitting region of the substrate and the end of the substrate. By filling the groove with the passivation film, the path (the interface between the substrate and the passivation film) of moisture penetrating from the end of the substrate to the light-emitting region becomes longer than in a case without the groove. As a result, the moisture resistance of the light-emitting apparatus improves.

In the light-emitting apparatus described in Japanese Patent Laid-Open No. 2006-120635, the organic layer having low moisture resistance is formed so as to exist not between the end of the substrate and the groove but only inside the groove. Therefore, it is necessary to secure an extra distance between the light-emitting region and the groove in consideration of the deposition accuracy of the organic layer. This results in an increase in size of the light-emitting apparatus. Further, if the organic layer is formed on the entire surface of the substrate without any measure, the organic layer is continuously formed from the end of the substrate to the light-emitting region, which may reduce the moisture resistance of the light-emitting apparatus.

SUMMARY OF THE INVENTION

Some aspects of the present invention provide a technique for improving the moisture resistance of a light-emitting apparatus while suppressing an increase in size of the light-emitting apparatus.

In consideration of the above-described problems, there is provided a light-emitting apparatus comprising: an insulating layer including a light-emitting region in which a first light-emitting element and a second light-emitting element are arranged, the second light-emitting element being arranged in a first direction with respect to the first light-emitting element; an organic layer arranged above the insulating layer and including a portion forming a part of the first light-emitting element and a part of the second light-emitting element; and a protective layer arranged above the organic layer, wherein the apparatus includes a groove between the light-emitting region and an end of the insulating layer in the insulating layer, a maximum value of a length of a line segment whose two ends are two points on edges of the groove is larger than a length of the light-emitting region in the first direction, and $D/Wg \geq 0.5$ is satisfied, Wg representing a maximum value of a length of a line segment, whose two ends are two points on the edges of the groove and which does not intersect with the edges of the groove, and D representing a depth of the groove.

Further features of the present invention will become apparent from the following description of exemplary embodiments (with reference to the attached drawings).

DESCRIPTION OF THE EMBODIMENTS

Figure 1A:
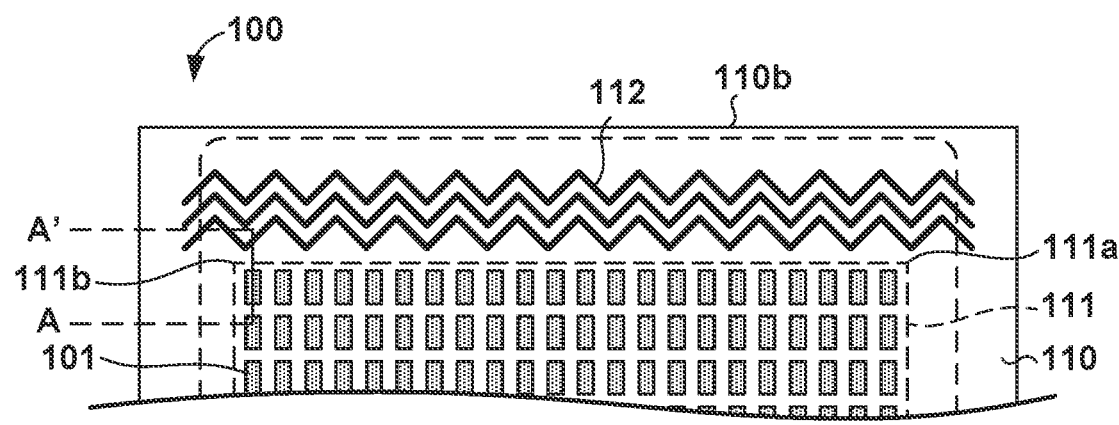
FIGS. 1A and 1B are views for explaining an arrangement example of a light-emitting apparatus according to some embodiments of the present invention.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

Figure 1B:
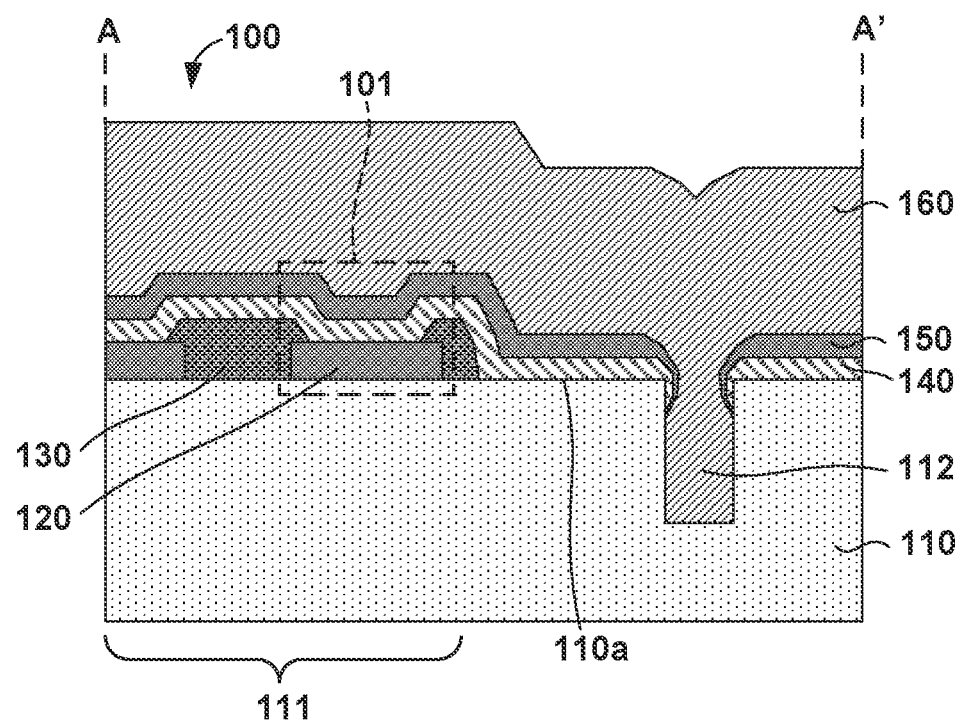

With reference to FIGS. 1A and 1B, an arrangement example of a light-emitting apparatus 100 according to some embodiments will be described. FIG. 1A shows a plan view of a portion of the light-emitting apparatus 100, and FIG. 1B shows a sectional view taken along a line A-N in FIG. 1A. For example, the light-emitting apparatus 100 may be mounted on an image forming apparatus such as a printer based on an electrophotographic technique. Further, the light-emitting apparatus 100 may be mounted on a display (display apparatus).

The light-emitting apparatus 100 includes an insulating layer 110, lower electrodes 120, an insulating film 130, an organic layer 140, an upper electrode 150, and a protective layer 160. The individual lower electrode 120, a part of the organic layer 140, and a part of the upper electrode 150 form an individual light-emitting element 101. The insulating layer 110 may be provided on a silicon substrate or a glass substrate. The insulating film 130 may also be referred to as a bank. The protective layer 160 may also be referred to as a sealing layer.

A plurality of the light-emitting elements 101 are arranged in a two-dimensional matrix in a light-emitting region 111 of the insulating layer 110. The light-emitting region 111 may be a smallest rectangular region that includes the plurality of the light-emitting elements 101. The light-emitting element 101 in this embodiment is a top emission type light-emitting element. Instead, the light-emitting element 101 may be a bottom emission type light-emitting element. In addition, the plurality of the light-emitting elements 101 may be arranged in a stripe array as shown in FIG. 1A, or may be arranged in a delta array or a square array. The insulating layer 110 may be a long substrate. In this case, the plurality of the light-emitting elements 101 may be arranged along the longitudinal direction of the long substrate. Further, in an image forming apparatus, such long substrates may be arranged in a staggered pattern. The center position of the staggered arrangement may overlap with the center of a lens connecting the light-emitting element 101 and a photoconductor.

A plurality of the lower electrodes 120 are arranged in a stripe array in the light-emitting region 111 of the insulating layer 110. The lower electrodes 120 are separated for each light-emitting element 101. That is, the light-emitting element 101 includes one of the plurality of the lower electrodes 120 separated from each other, and the light-emitting element 101 is formed for each lower electrode 120. The lower electrodes 120 are electrically separated from each other by the insulating film 130. The lower electrode 120 may be formed of a metal material having a reflectance of 70% or more at the emission wavelength. For example, the lower electrode 120 may be formed of a metal such as Al or Ag, or an alloy obtained by adding Si, Cu, Ni, Nd, or the like to the metal. The emission wavelength refers to a spectral range of light emitted from the organic layer 140. As long as the reflectance condition is satisfied, the lower electrode 120 may be a stacked electrode with a barrier electrode formed of, for example, a metal such as Ti, W, Mo, or Au, or an alloy thereof, or may be a stacked electrode with a transparent oxide film electrode formed of ITO, IZO, or the like.

The insulating film 130 is arranged on an upper surface 110a of the insulating layer 110 so as to fill a space between the lower electrodes 120 adjacent to each other. In addition, a part of the insulating film 130 partially rides on the upper surface of the lower electrode 120. The insulating film 130 is formed of a silicon nitride (SiN) film, a silicon oxynitride (SiON) film, a silicon oxide (SiO) film, or the like formed using a chemical vapor deposition method (CVD method). Among these films, the SiN film or the SiON film having a high barrier property against moisture may be used.

The organic layer 140 is arranged on the insulating layer 110 so as to cover the lower electrode 120 and the insulating film 130. The organic layer 140 includes a portion forming a part of the light-emitting element 101. The organic layer 140 is formed of an organic compound containing one or more kinds of light-emitting materials such as a fluorescent material and a phosphorescent material. The light emitted from the organic layer 140 may have any color. For example, the organic layer 140 may emit white light. The film thickness of the organic layer 140 may be a film thickness that enhances a desired emission wavelength, or may be a film thickness that attenuates a predetermined emission wavelength. Further, the light-emitting elements 101 may emit light components of different colors.

The upper electrode 150 is formed on the organic layer 140 so as to cover the organic layer 140. The upper electrode 150 is provided commonly to the plurality of the light-emitting elements 101. In other words, one upper electrode 150 is shared by the plurality of the light-emitting elements 101. The upper electrode 150 functions as a semi-transmissive reflective layer having a property (that is, semi-transmissive reflectivity) of transmitting part of the light reaching its surface and reflecting the other part of the light. The upper electrode 150 may be formed of, for example, a metal such as magnesium or silver, an alloy containing magnesium or silver as a main component, or an alloy material containing an alkali metal or an alkaline earth metal. Further, the upper electrode 150 may be a transparent oxide film electrode formed of ITO, IZO, or the like. The upper electrode 150 may have a stacked structure of the above-described layer and electrode.

The protective layer 160 is arranged on the upper electrode 150 so as to cover the upper electrode 150. That is, the protective layer 160 is arranged above the organic layer 140. The protective layer 160 may be formed of a silicon compound formed using a chemical vapor deposition method (CVD method), for example, a material such as silicon nitride (SiN) or silicon oxynitride (SiON). Instead, the protective layer 160 may be formed of a material such as an aluminum oxide film, silicon oxide, or titanium oxide formed using an atomic layer deposition method (ALD method). All of these materials have low permeability to oxygen and moisture from the outside. The protective layer 160 may be a single layer, or may have a stacked structure.

A plurality of grooves 112 are formed in the upper surface 110a of the insulating layer 110. In this embodiment, three grooves 112 having the same shape are formed in the insulating layer 110. Instead, only one groove 112 or another number of grooves 112 may be formed. The shapes of the grooves 112 may be different from each other. The groove 112 is located between the light-emitting region 111 and an end 110b of the insulating layer 110. The groove 112 continuously extends along the end 110b.

The plurality of the light-emitting elements 101 arranged in the light-emitting region 111 include two light-emitting elements 101 adjacent to each other in a lateral direction in FIG. 1A. One of the two light-emitting elements 101 is adjacent to the other light-emitting element in the lateral direction. Further, one side of the light-emitting region 111 extends in the lateral direction from one corner 111a to another corner 111b. The maximum value of the length of a line segment whose two ends are two points on the edges of one groove 112 is larger than the length of the light-emitting region 111 in the lateral direction (that is, the length from the corner 111a to the corner 111b). For example, the groove 112 is longer than the light-emitting region in the lateral direction. Thus, on the lateral side of the insulating layer 110, the light-emitting region 111 is entirely covered by the groove 112.

The groove 112 extends from the vicinity of the one corner 111a of the light-emitting region 111 to the vicinity of the other corner 111b of the light-emitting region 111. The vicinity of the corner 111a may be, for example, a region within a circle centered on the corner 111a and having a radius that is the minimum distance from the corner 111a to the end 110b. The groove 112 extending from the vicinity of the corner 111a to the vicinity of the corner 111b means that a portion of the groove 112 in the vicinity of the corner 111a and a portion thereof in the vicinity of the corner 111b are connected to each other. Therefore, the end portion of the groove 112 may not be located in the vicinity of the corner 111a or 111b.

In the example shown in FIG. 1A, the groove 112 is arranged only on one side of the insulating layer 110. Instead, the groove 112 may also be arranged on another side of the insulating layer 110. Further, the groove 112 may have an annular shape and surround the light-emitting region 111.

As shown in FIG. 1B, the bottom surface and a part of the sidewall of the groove 112 are not in contact with the organic layer 140 but in contact with the protective layer 160. In other words, the organic layer 140 is separated in the groove 112 by the protective layer 160, more specifically, by the portion of the protective layer 160 that has entered the groove 112. The moisture permeation rate of the organic layer 140 is about 1 to 2 orders of magnitude higher than that of the protective layer 160. Therefore, by separating the organic layer 140 by the protective layer 160, it is possible to suppress moisture permeation along the surface of the insulating layer 110.

Next, a manufacturing method of the light-emitting apparatus 100 will be described. First, the groove 112 is formed in the insulating layer 110. The lower electrodes 120 are formed on the upper surface 110a of the insulating layer 110. The lower electrodes 120 are formed by, for example, patterning a conductor layer formed on the upper surface 110a of the insulating layer 110. After that, the insulating film 130 is formed between the plurality of the lower electrodes 120.

Then, the organic layer 140 is formed by vapor-depositing the material of the organic layer 140 from the upper surface 110a side of the insulating layer 110. Vapor deposition for forming the organic layer 140 is performed without using a mask (for example, without using a high-precision mask). Therefore, as shown in FIG. 1A, the organic layer 140 is also formed between the end 110b of the insulating layer 110 and the groove 112. A rough mask may be used such that the organic material is vapor-deposited only in the light-emitting region during the vapor deposition. The rough mask limits the vapor-deposition region such that the substrate end of the light-emitting apparatus and the light-emitting region have different vapor deposition amounts.

Then, the upper electrode 150 and the protective layer 160 are sequentially formed. A part of the protective layer 160 enters the groove 112 of the insulating layer 110. Further, a color filter, an adhesive layer, protective glass, a polarizing plate, or the like may be formed on the protective layer 160.

Figure 2A:
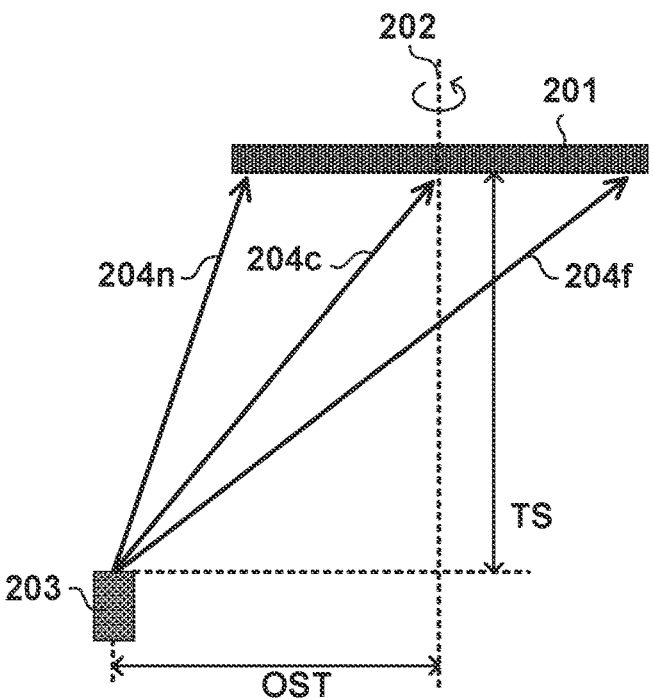
FIGS. 2A to 2C are views for explaining a situation in which a material adheres inside a groove due to vapor deposition.
Figure 2B:
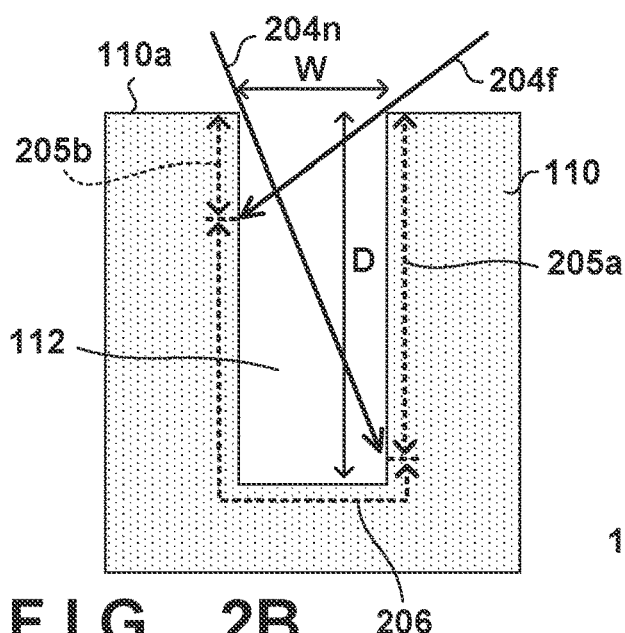

With reference to FIGS. 2A and 2B, vapor deposition for forming the organic layer 140 will be described more specifically. The vapor deposition is performed using, for example, a vapor deposition apparatus shown in FIG. 2A. The vapor deposition apparatus includes a table 201 and a crucible 203 containing a vapor deposition source. The table 201 can rotate around a central axis 202. FIG. 2A shows a section of the vapor deposition apparatus in a plane passing through the central axis 202 and the crucible 203. The insulating layer 110 is arranged on the surface of the table 201 on the crucible 203 side. The crucible 203 is located at a position separated from the plane passing through the upper surface 110a of the substrate installed on the table 201 by a target-substrate distance TS and separated from the central axis 202 by an offset distance OST. A plurality of the crucibles 203 can be arranged in one deposition chamber.

In order to ensure the deposition uniformity, the vapor deposition is performed on the insulating layer 110 while rotating the table 201. Therefore, the portion on the insulating layer 110 closest to the crucible 203 is deposited by a particle bundle 204n. The film at the position on the insulating layer 110 passing through the central axis 202 is formed by a particle bundle 204c. The film at the position on the insulating layer 110 farthest from the crucible 203 is formed by a particle bundle 204f.

Figure 2C:
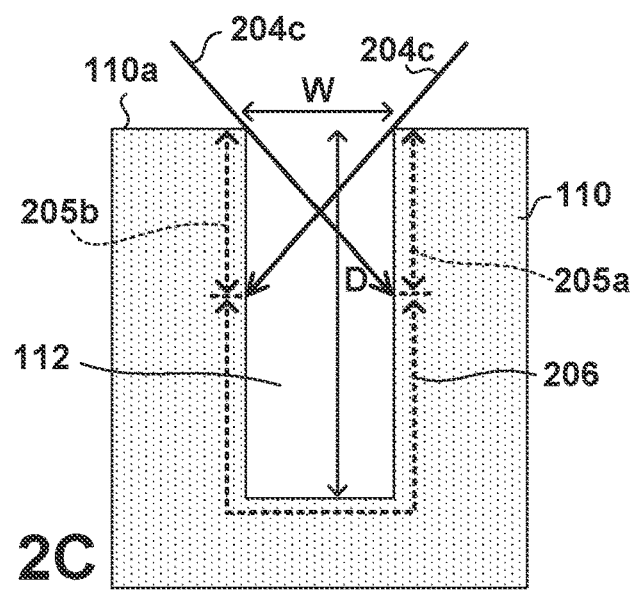

With reference to FIGS. 2B and 2C, a situation in which the material of the organic layer 140 is formed into a film on the sidewall and bottom surface of the groove 112 of the insulating layer 110 will be described. In the following description, the sidewall and bottom surface of the groove 112 are collectively referred to as the inner surface of the groove 112. FIG. 2B shows a section of the groove 112 located near the end of the table 201 in a plane passing through the central axis 202 and the crucible 203. FIG. 2C shows a section of the groove 112 located at a position passing through the central axis 202 of the table 201 in a plane passing through the central axis 202 and the crucible 203.

As shown in FIG. 2B, when the groove 112 is located at a closest position from the crucible 203, the particle bundle 204n reaches the right sidewall of the groove 112, so that the organic material is formed into a film in a region 205a. When the table 201 rotates 180° and the groove 112 is located at the farthest position from the crucible 203, the particle bundle 204f reaches the left sidewall of the groove 112, so that the organic material is formed into a film in a region 205b. No film is formed in a region 206 of the inner surface of the groove 112 by these particle bundles 204n and 204f.

As shown in FIG. 2C, at some timing, the particle bundle 204c reaches the right sidewall of the groove 112, so that the organic material is formed into a film in the region 205a. When the table 201 is rotated 180° from that state, the particle bundle 204c reaches the left sidewall of the groove 112, so that the organic material is formed into a film in the region 205b. No film is formed in the region 206 of the inner surface of the groove 112 by the particle bundle 204c.

Since the coverage of the protective layer 160 is higher than that of the organic vapor deposition method, if there is the region 206 in which no organic material is formed into a film, the protective layer 160 contacts the region 206 so that the organic layer 140 is separated. The ratio of the region 206 to the inner surface of the groove 112 is referred to as a non-deposition ratio. When the non-deposition ratio is 1, it indicates that no organic material is formed into a film on the inner surface of the groove 112. When the non-deposition ratio is 0, it indicates that the organic material is formed into a film on the entire inner surface of the groove 112. When W represents the width of the upper end of the groove 112 and D represents the depth of the groove 112, the non-deposition ratio depends on the ratio of the depth D to the width W. In general, the larger the value of D/W (referred to as an aspect ratio hereinafter), the larger the non-deposition ratio of the groove 112. The depth D may be 3.5 µm, for example.

Figure 3A:
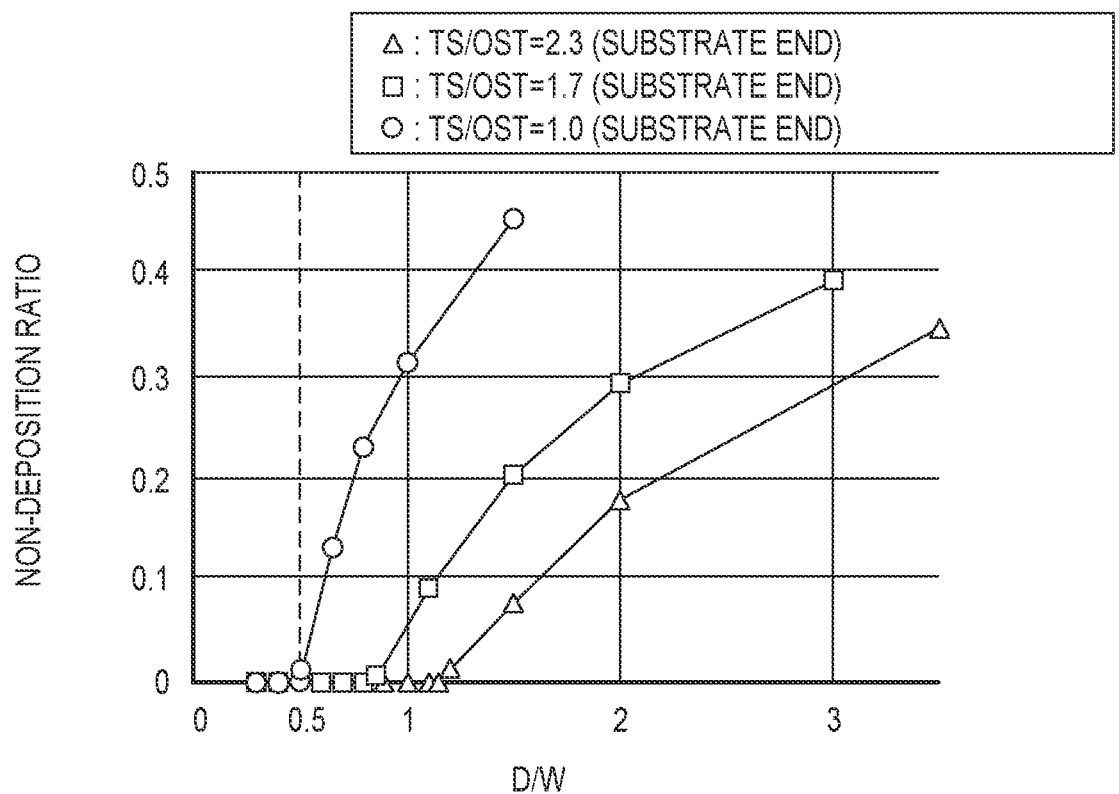
FIGS. 3A and 3B are graphs for explaining the ratio of the area in which an organic film is vapor-deposited inside the groove.
Figure 3B:
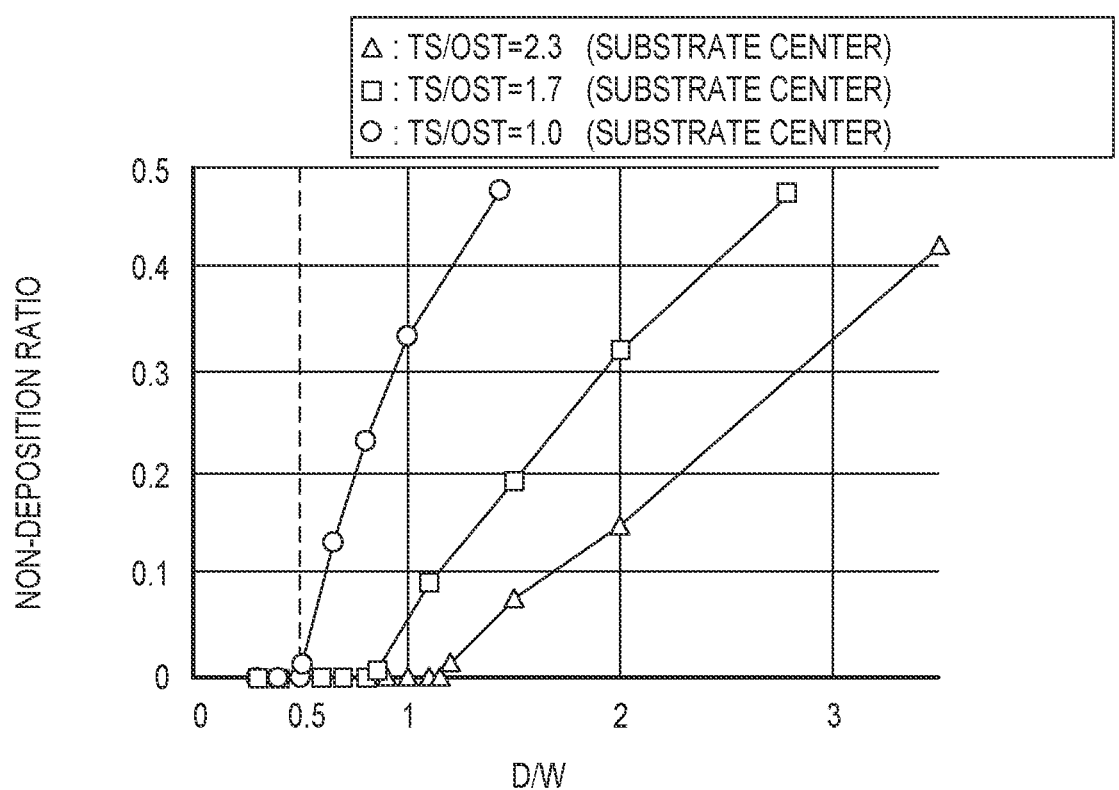

With reference to FIGS. 3A and 3B, the result of an experiment in which the value of the non-deposition ratio with respect to the aspect ratio was obtained will be described. FIG. 3A shows a graph showing the non-deposition ratios for various aspect ratios (D/W) in a case in which the groove 112 is located near the end of the substrate. FIG. 3B shows a graph showing the non-deposition ratios for various aspect ratios in a case in which the groove 112 is located near the center of the substrate. In both graphs, a circle mark indicates the case of TS/OST=1.0, a square mark indicates the case of TS/OST=1.7, and a triangle mark indicates the case of TS/OST=2.3.

When TS/OST is smaller than 1, the particle bundle is hardly formed into a film on the substrate, so that the utilization efficiency of the organic material significantly decreases. Therefore, in general, vapor deposition is performed in an environment in which TS/OST is equal to or larger than 1. As can be seen from FIGS. 3A and 3B, in an environment in which TS/OST is equal to or larger than 1, if the aspect ratio is equal to or larger than 0.5, the non-deposition ratio can be a positive value regardless of the position of the groove 112 on the table 201. Therefore, there is the region 206 in which the organic material is not formed into a film, and the organic layer 140 is separated by the protective layer 160. Further, it was also found that in the environment in which TS/OST is equal to or larger than 1.5, if the aspect ratio is equal to or larger than 0.8, the non-deposition ratio can be a positive value regardless of the position of the groove 112 on the table 201.

As has been described above, the vapor deposition is performed while rotating the insulating layer 110 arranged on the table 201. Accordingly, whether the organic material is formed into a film on each point on the inner surface of the groove 112 depends on whether the aspect ratio satisfies the above-described condition for an arbitrary section passing through each point and orthogonal to the upper surface 110a of the insulating layer 110. The groove 112 of the light-emitting apparatus 100 according to this embodiment extends in a zigzag shape. Therefore, the ratio of the region in which the organic material is not vapor-deposited can be increased as compared with the groove extending linearly. That is, the groove of the light-emitting apparatus may have a zigzag pattern. And the groove of the light-emitting apparatus may have a wrapping pattern. The wrapping pattern including a first part extending to a first direction and a second part extending to a second direction different from the first direction.

Figure 4A:
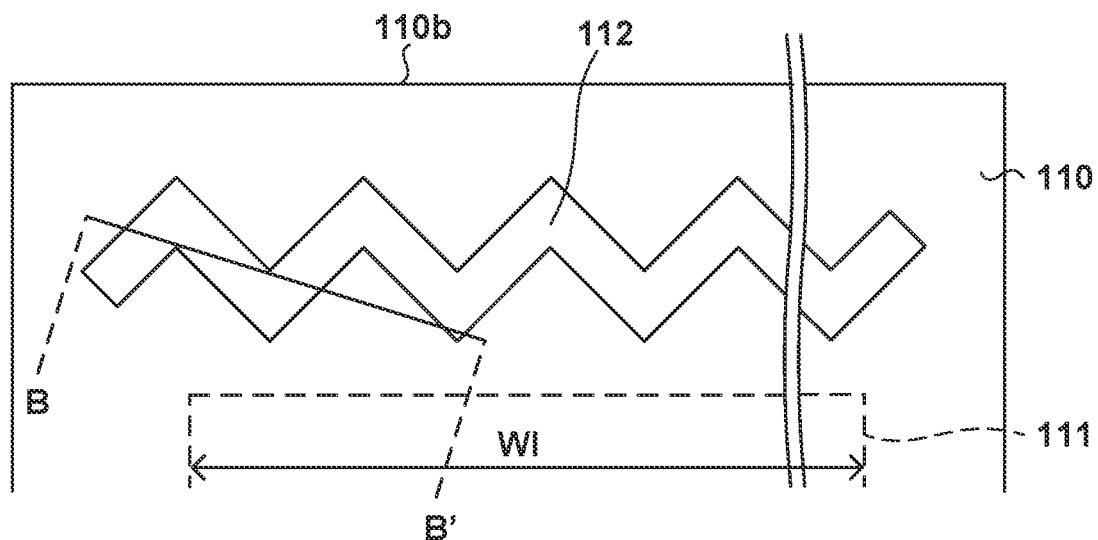
FIGS. 4A and 4B are views for explaining the detailed shape of the groove of the light-emitting apparatus shown in FIGS. 1A and 1B.
Figure 4B:
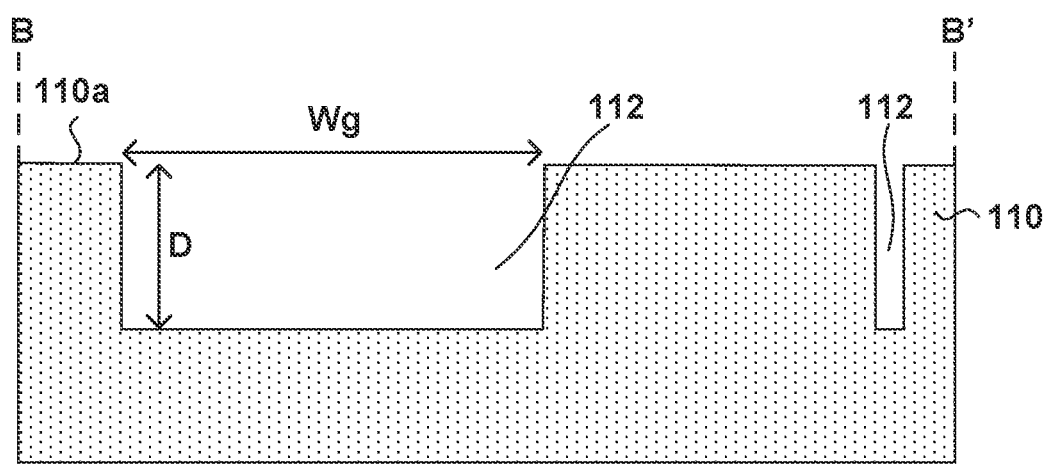

With reference to FIGS. 4A and 4B, the shape of the groove 112 will be described in detail. For the sake of simplicity, only one groove 112 is shown in each of FIGS. 4A and 4B. FIG. 4A shows a plan view of a part of the insulating layer 110, and FIG. 4B shows a sectional view taken along a line B-B' shown in FIG. 4A. The section along the line B-B' is the section in which the distance at which the upper surface 110a of the insulating layer 110 is separated by the groove 112 is maximum. This section may be orthogonal to the upper surface 110a of the insulating layer 110, or may intersect with another component. In this section, let Wg be the maximum value of the distance at which the upper surface 110a of the insulating layer 110 is separated by the groove 112. In other words, Wg can be the maximum value of the length of a line segment whose two ends are two points on the edges of the groove 112 and which does not intersect with the edges of the groove 112. In FIG. 4B, the upper surface 110a of the insulating layer 110 is separated by the groove 112 in two places, and the separation distance (that is, the length of a line segment whose two ends are two points on the edges of the groove 112 and which does not intersects with the edges of the groove 112) on the left side is maximum. Let Wl be the width of the light-emitting region 111 in the direction parallel to the end 110b of the insulating layer 110.

As has been described above, the smaller the maximum value Wg, the higher the ratio of the region in which the organic material is not vapor-deposited, and thus the water resistance of the light-emitting apparatus 100 also improves. Therefore, for example, the groove 112 may have a shape satisfying Wg<Wl. Further, when D represents the depth of the groove 112, the groove 112 may have a shape satisfying D/Wg≥0.5. The depth D of the groove is 3.5 µm, for example. Furthermore, the groove 112 may have a shape satisfying D/Wg≥0.8.

Figure 5A:
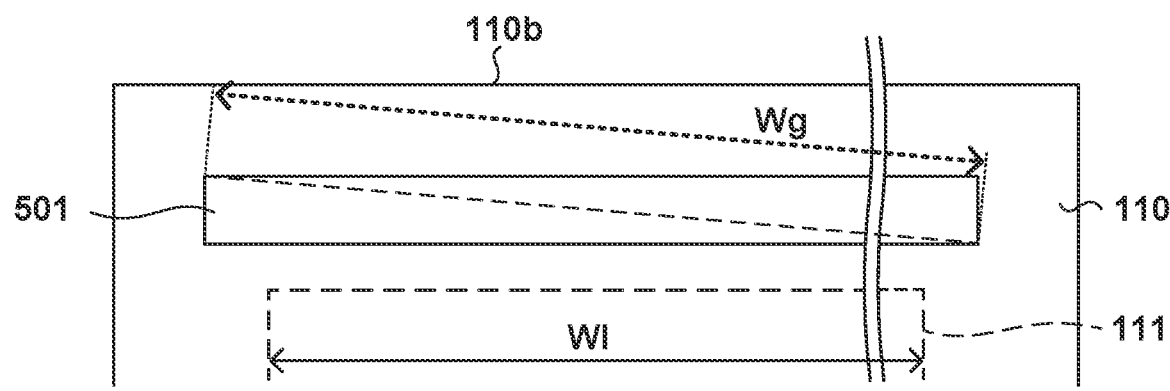
FIGS. 5A and 5B are views for explaining the shapes of the groove in comparative examples.
Figure 5B:
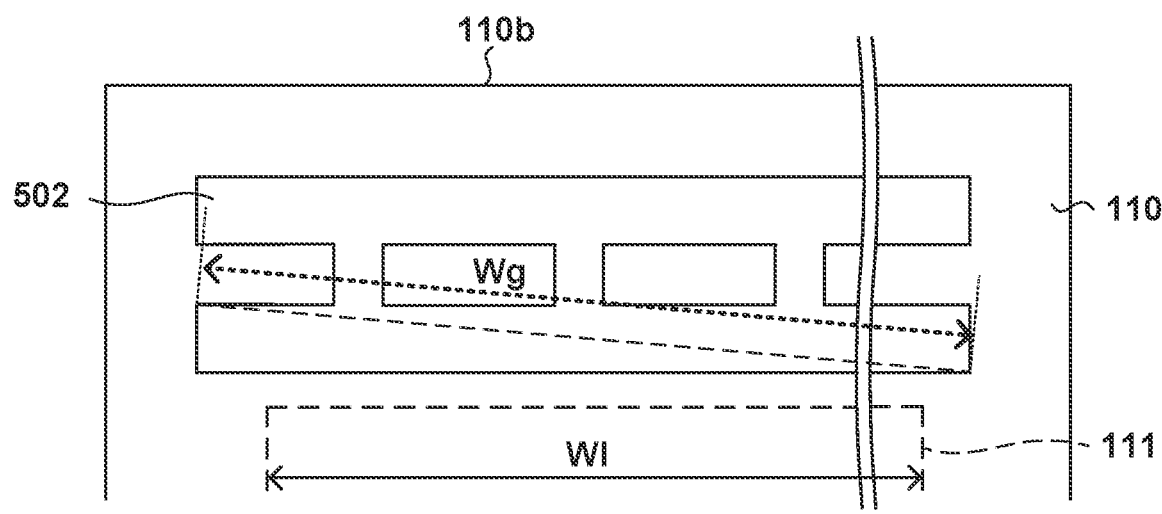

With reference to FIGS. 5A and 5B, the shapes of the grooves according to comparative examples will be described. Each of FIGS. 5A and 5B is a plan view corresponding to FIG. 4A. In the insulating layer 110 shown in FIG. 5A, a groove 501 extending linearly along the light-emitting region 111 is formed. As can be seen from FIG. 5A, the section in which the distance at which the upper surface of the insulating layer 110 is separated by the groove 501 is maximum is the section passing through the diagonal line of the groove. The maximum value Wg of the distance at which the upper surface of the insulating layer 110 is separated (that is, the length of a line segment whose two ends are two points on the edges of the groove and which does not intersect with the edges of the groove) in this section is larger than the width Wl of the light-emitting region 111. Therefore, the water resistance is inferior to that of the light-emitting apparatus 100 according to this embodiment.

In the insulating layer 110 shown in FIG. 5B, a groove 502 extending in a lattice shape along the light-emitting region 111 is formed. As can be seen from FIG. 5B, the section in which the distance at which the upper surface of the insulating layer 110 is separated by the groove 502 is maximum is the section passing through the diagonal line of the straight part of the groove. The maximum value Wg of the distance at which the upper surface of the insulating layer 110 is separated in this section is larger than the width Wl of the light-emitting region 111. Therefore, the water resistance is inferior to that of the light-emitting apparatus 100 according to this embodiment.

As has been described above, according to this embodiment, even if the organic layer 140 is formed by maskless vapor deposition, the ratio of the inner surface of the groove 112 on which the organic material is formed into a film can be reduced, so that the water resistance of the light-emitting apparatus 100 can be improved while suppressing an increase in size of the light-emitting apparatus 100. Thus, the light-emitting apparatus 100 having excellent light-emitting characteristics can be provided.

Figure 6A:
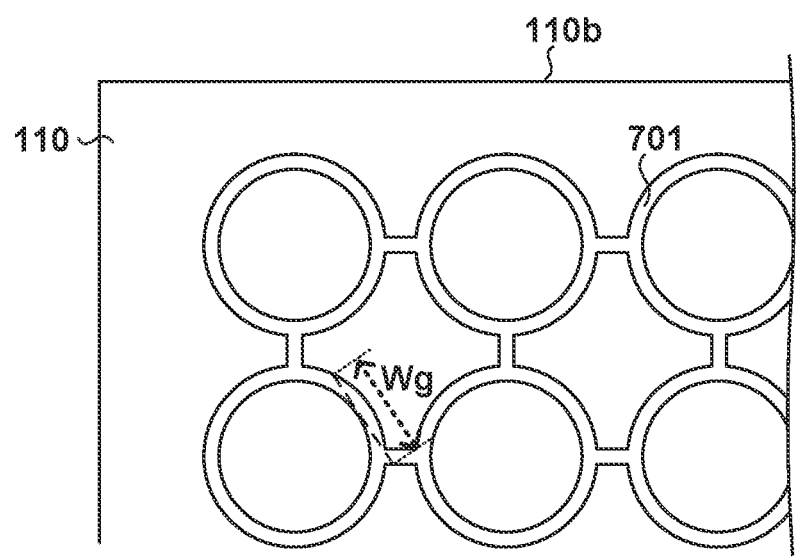
FIGS. 6A and 6B are views for explaining modifications of the groove of the light-emitting apparatus shown in FIGS. 1A and 1B.
Figure 6B:
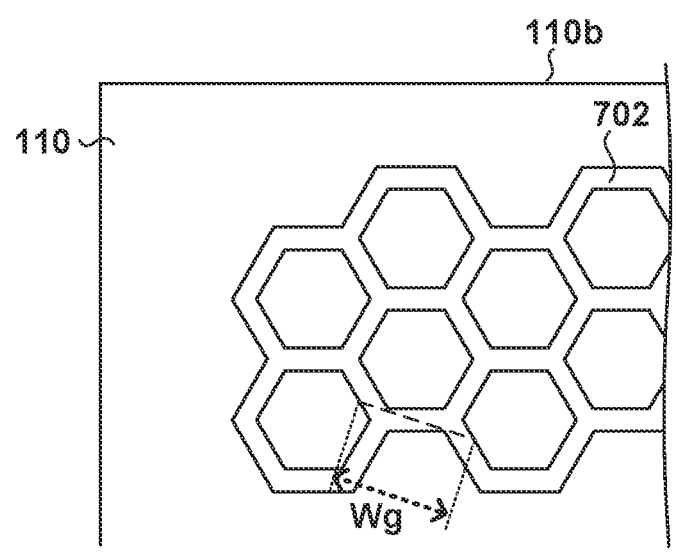

With reference to FIGS. 6A and 6B, modifications of the shape of the groove 112 of the light-emitting apparatus 100 shown in FIGS. 1A and 1B will be described. The light-emitting apparatus 100 may include a groove 701 shown in FIG. 6A instead of the groove 112. The groove 701 has a shape in which a plurality of circumferential grooves are connected to each other. The plurality of circumferential grooves may be arranged in two rows as shown in FIG. 6A. Alternatively, the plurality of circumferential grooves may be arranged in one row or another number of rows, or may not be arranged in an array. The inner diameter of each circumferential groove may be, for example, 1.0 µm, 1.5 µm, 2.5 µm, or 3.5 µm. Similarly to the groove 112, the maximum value Wg of the distance at which the upper surface of the insulating layer 110 is separated by the groove 701 is smaller than the width Wl of the light-emitting region 111. Further, when D represents the depth of the groove 701, the groove 701 may satisfy D/Wg≥0.5 or D/Wg≥0.8.

The light-emitting apparatus 100 may include a groove 702 shown in FIG. 6B instead of the groove 112. The groove 702 has a delta pattern. More specifically, the groove 702 has a shape in which a plurality of hexagonal grooves are connected to each other. Instead of the hexagon, another polygonal shape may be used. The plurality of hexagonal grooves may be arranged in two rows as shown in FIG. 6B. Alternatively, the plurality of hexagonal grooves may be arranged in one row or another number of rows. The length of one side of each hexagon may be, for example, 1.0 µm, 1.5 µm, 2.5 µm, or 3.5 µm. Similarly to the groove 112, the maximum value Wg of the distance at which the upper surface of the insulating layer 110 is separated by the groove 702 is smaller than the width Wl of the light-emitting region 111. Further, when D represents the depth of the groove 702, the groove 702 may satisfy D/Wg≥0.5 or D/Wg≥0.8.

Figure 7A:
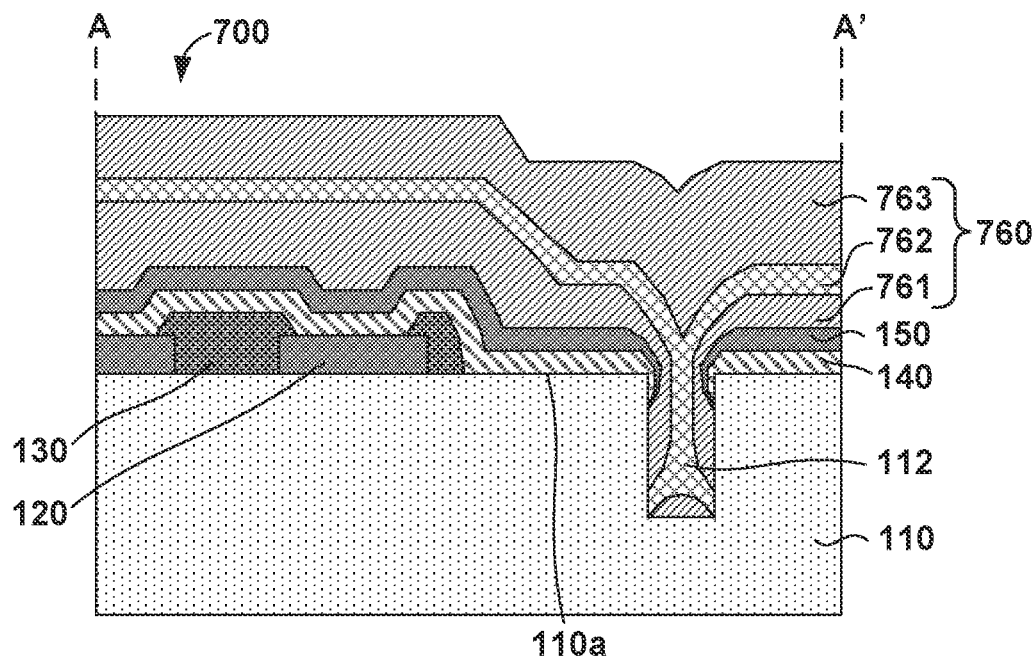
FIGS. 7A and 7B are views for explaining modifications of the light-emitting apparatus shown in FIGS. 1A and 1B.
Figure 7B:
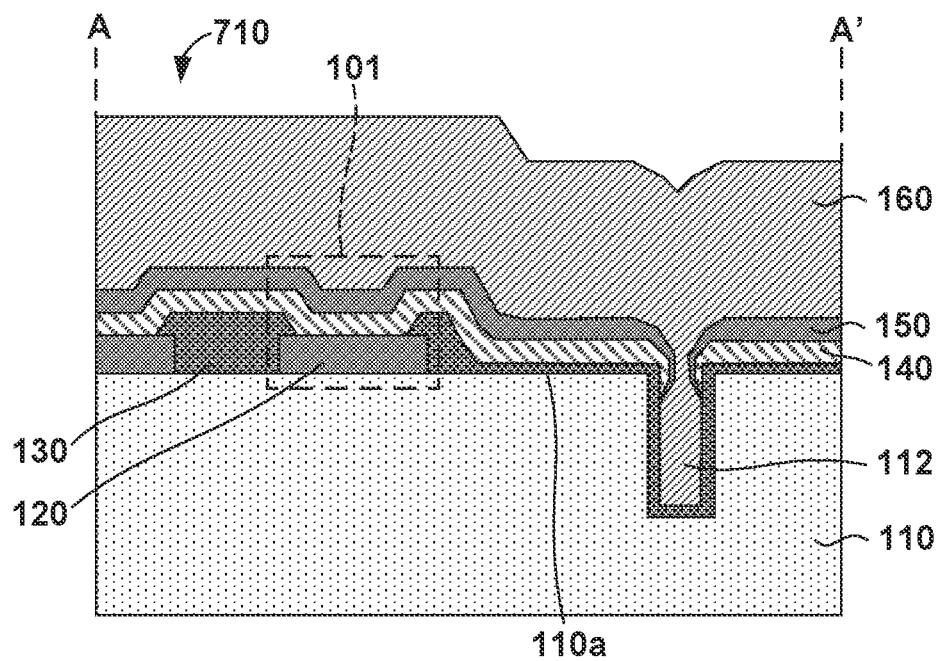

With reference to FIGS. 7A and 7B, modifications of the light-emitting apparatus 100 shown in FIGS. 1A and 1B will be described. FIG. 7A shows a sectional view of a light-emitting apparatus 700 according to one modification. FIG. 7A corresponds to FIG. 1B. The light-emitting apparatus 700 is different from the light-emitting apparatus 100 in that a protective layer 760 is provided instead of the protective layer 160. Other points may be similar to those in the light-emitting apparatus 100.

The protective layer 760 has a structure in which a protective layer 761, a coverage layer 762, and a protective layer 763 are sequentially stacked. The protective layer 761 and the protective layer 763 may be formed of a material similar to that of the protective layer 160. The coverage layer 762 contains $Al_2O_3$, $TiO_2$, and/or $SiO_2$. A void may be generated in the protective layer 761 during the film growth depending on the shape of the groove 112 and the deposition conditions of the protective layer 761. Water may penetrate into the light-emitting region 111 through the void. By forming the coverage layer 762 on the protective layer 761, as shown in FIG. 7A, it is possible to fill the void formed in the protective layer 761. This improves the sealing performance of the protective layer 760. The protective layer 763 is formed on the coverage layer 762 and protects the coverage layer 762.

FIG. 7B shows a sectional view of a light-emitting apparatus 710 according to another modification. FIG. 7B corresponds to FIG. 1B. The light-emitting apparatus 710 is different from the light-emitting apparatus 100 in that a part of the insulating film 130 covers the inner surface of the groove 112. Other points may be similar to those in the light-emitting apparatus 100. When the insulating film 130 is formed of a silicon nitride (SiN) film or a silicon oxynitride (SiON) film, water penetration can be suppressed through the substrate bulk. Instead of the part of the insulating film 130 covering the inner surface of the groove 112, a film different from the insulating film 130 may cover the inner surface of the groove 112.

Figure 8A:
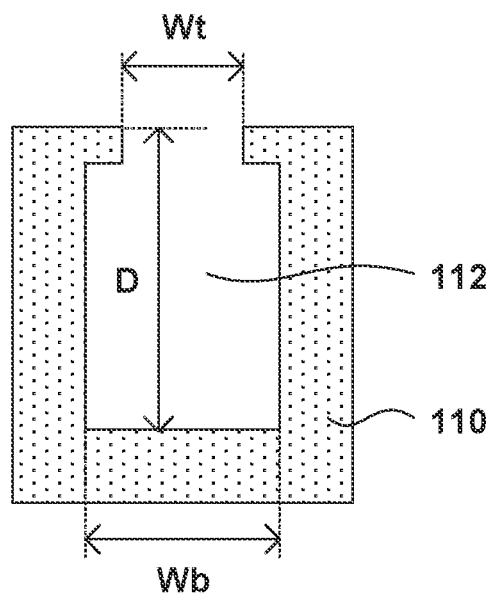
FIGS. 8A and 8B are views for explaining modifications of the groove of the light-emitting apparatus shown in FIGS. 1A and 1B.
Figure 8B:
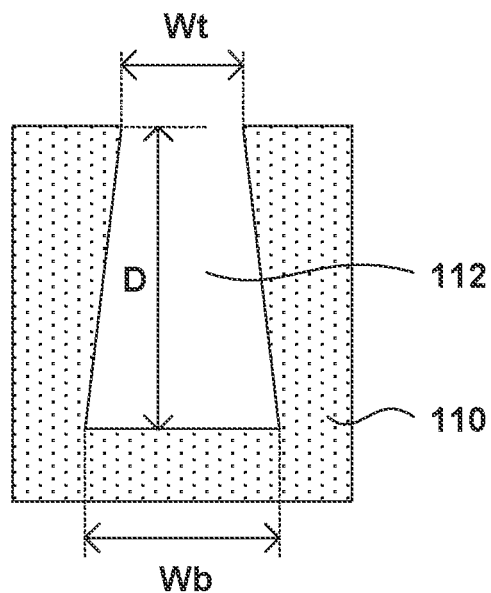

With reference to FIGS. 8A and 8B, modifications of the shape of the groove 112 of the light-emitting apparatus 100 shown in FIGS. 1A and 1B will be described. As shown in FIG. 1B, the taper angle of the groove 112 is a right angle. Instead, the groove 112 may be tapered toward the upper end as shown in FIGS. 8A and 8B. More specifically, the groove 112 shown in FIG. 8A has an undercut structure, and a width Wt at the upper end is smaller than a width Wb at the lower end. The groove 112 shown in FIG. 8B has an inverse taper structure, and the width Wt at the upper end is smaller than the width Wb at the lower end.

Application of Light-Emitting Apparatus According to Some Embodiments of Present Invention The light-emitting apparatus according to the above-described embodiment of the present invention can be used as a constituent member of a display apparatus or an illumination apparatus. In addition, the light-emitting apparatus is applicable to the exposure light source of an electrophotographic image forming apparatus, the backlight of a liquid crystal display apparatus, a light-emitting apparatus including a color filter in a white light source, and the like. An electrophotographic printer includes, for example, a photoconductor and a light-emitting apparatus that applies light to the photoconductor. The light-emitting apparatus of the printer may be the light-emitting apparatus according to the above-described embodiment.

The display apparatus may be an image information processing apparatus that includes an image input unit for inputting image information from an area CCD, a linear CCD, a memory card, or the like, and an information processing unit for processing the input information, and displays the input image on a display unit.

In addition, a display unit included in an image capturing apparatus or an inkjet printer may have a touch panel function. The driving type of the touch panel function may be an infrared type, a capacitance type, a resistive film type, or an electromagnetic induction type. The display apparatus may be used for the display unit of a multifunction printer.

Figure 9:
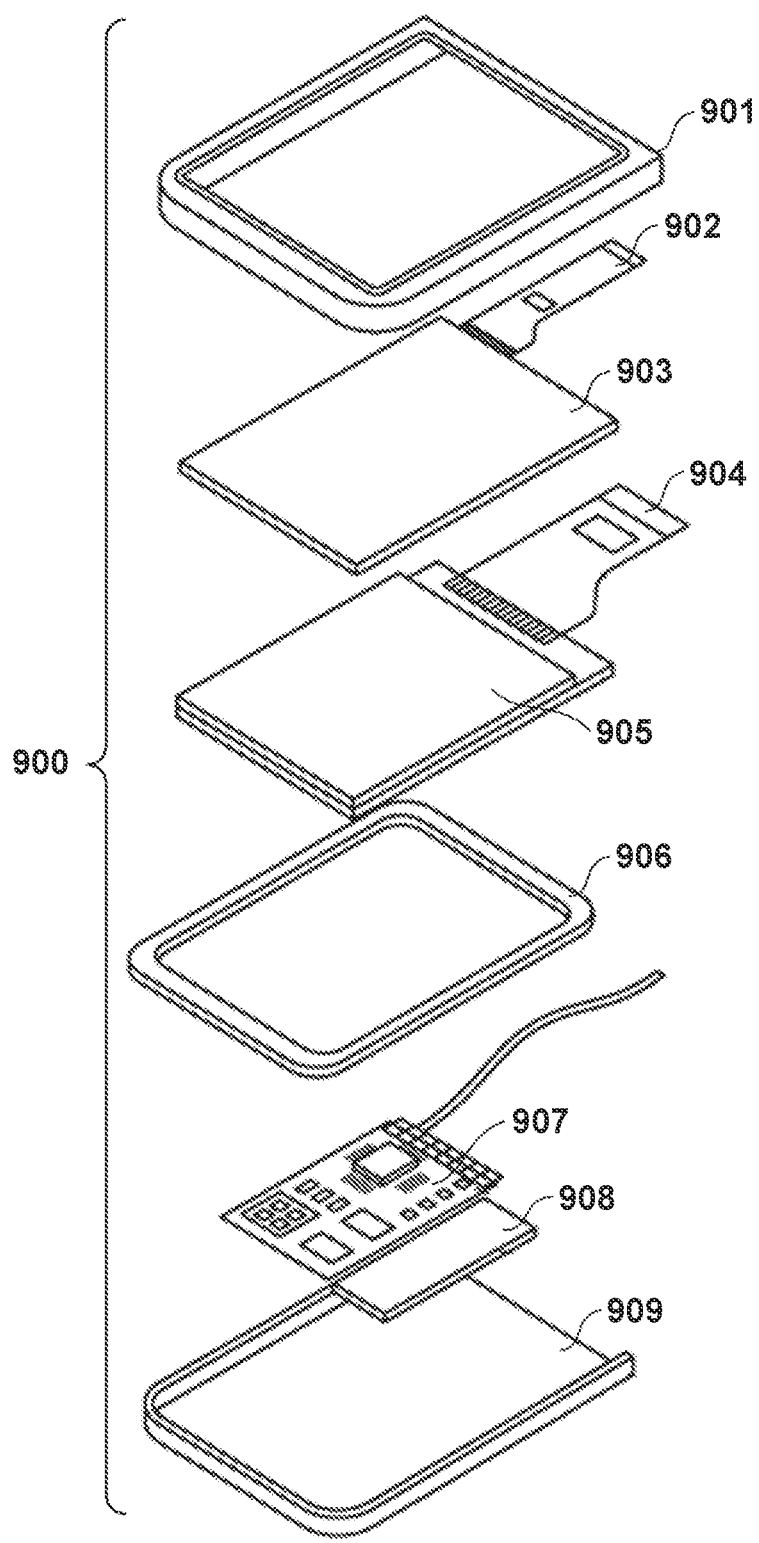
FIG. 9 is a view showing an arrangement example of a display apparatus according to some embodiments of the present invention.

FIG. 9 is a view schematically showing an example of the display apparatus according to some embodiments. A display apparatus 900 may include, between an upper cover 901 and a lower cover 909, a touch panel 903, a display panel 905, a frame 906, a circuit board 907, and a battery 908. The touch panel 903 and the display panel 905 are connected to flexible printed circuit FPCs 902 and 904, respectively. Transistors are printed on the circuit board 907. The battery 908 may not be provided if the display apparatus is not a portable apparatus, or may be provided in another position even if the display apparatus is a portable apparatus. The display apparatus 900 includes a plurality of pixels, and at least one of the plurality of pixels includes the light-emitting element of the light-emitting apparatus according to the above-described embodiment and a transistor connected to the light-emitting element.

The display apparatus according to this embodiment may include red, green, and blue color filters. The red, green, and blue color filters may be arranged in a delta array.

The display apparatus according to this embodiment may be used for the display unit of a mobile terminal. In this case, the display apparatus may have both a display function and an operation function. Examples of the mobile terminal include a mobile phone such as a smartphone, a tablet, and a head mounted display.

The display apparatus according to this embodiment may be used for the display unit of an image capturing apparatus (photoelectric conversion apparatus) that includes an optical unit including a plurality of lenses and an image sensor that receives light passing through the optical unit. The display unit of the image capturing apparatus may display an image captured by the image sensor. The display unit may be a display unit exposed to the outside of the image capturing apparatus, or a display unit arranged in a viewfinder. The image capturing apparatus may be a digital camera or a digital video camera.

Figure 10A:
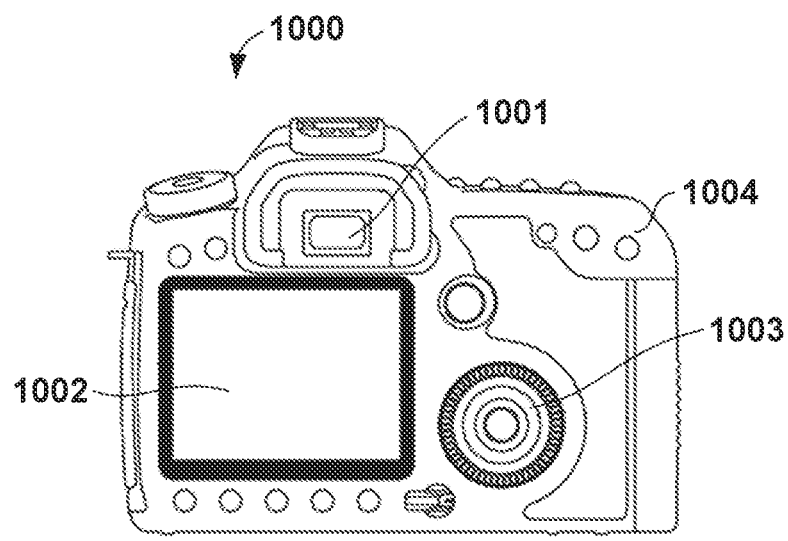
FIGS. 10A is a view showing an arrangement example of a display apparatus according to some embodiments of the present invention.

FIG. 10A is a view schematically showing an example of an image capturing apparatus according to this embodiment. An image capturing apparatus 1000 may include a viewfinder 1001, a rear display 1002, an operation unit 1003, and a housing 1004. The viewfinder 1001 may include the display apparatus according to this embodiment. In this case, the display apparatus may display not only an image to be captured, but also environment information, an image capturing instruction, and the like. The environment information may include the intensity of ambient light, the direction of ambient light, the moving speed of an object, the possibility that the object is blocked by a shielding object, or the like.

Since the above-described light-emitting apparatus includes the organic light-emitting element, the response speed is high. Therefore, information can be displayed in a short time suitable for image capturing. The display apparatus using the organic light-emitting element can be used in the apparatus that requires a high display speed.

The image capturing apparatus 1000 includes an optical unit (not shown). The optical unit includes a plurality of lenses and forms an image on an image sensor housed in the housing 1004. It is possible to adjust the focus by adjusting the relative positions of the plurality of lenses. This operation can be performed automatically.

Figure 10B:
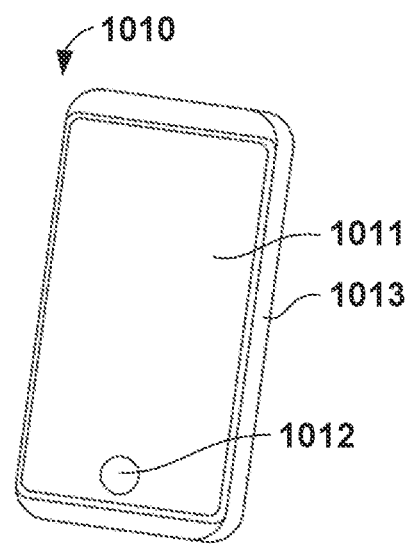
FIG. 10B is a view showing an arrangement example of electronic equipment according to some embodiments of the present invention.

FIG. 10B is a view schematically showing an example of electronic equipment according to this embodiment. Electronic equipment 1010 includes a display unit 1011, an operation unit 1012, and a housing 1013 in which the display unit 1011 is provided. The housing 1013 may include a circuit, a printed board including the circuit, a battery, and a communication unit. The communication unit is used for communication with the outside. The operation unit 1012 may be a button or a touch panel type sensing unit. The operation unit 1012 may be a biometrics unit that recognizes a fingerprint and releases a lock or the like. Electronic equipment including a communication unit can also be called communication equipment. The electronic equipment may be provided with a lens and an image sensor so as to further have a camera function. An image captured by the camera function is displayed on the display unit 1011. Examples of the electronic equipment include a smartphone and a notebook personal computer.

Figure 11A:
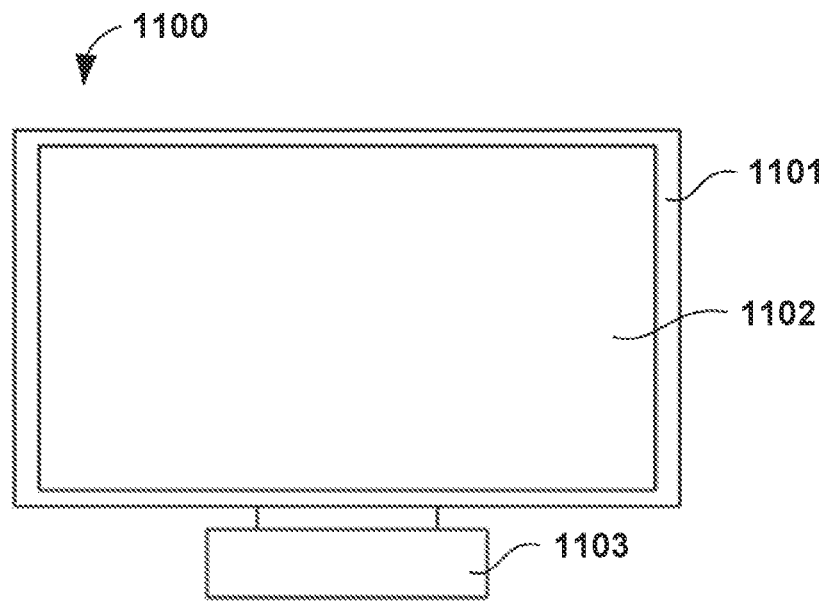
FIG. 11A is a view showing an arrangement example of a display apparatus according to some embodiments of the present invention.
Figure 11B:
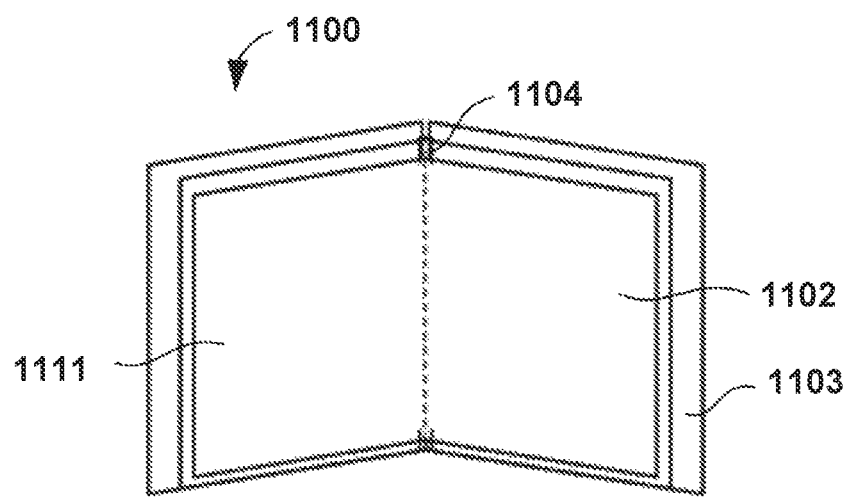
FIG. 11B is a view showing an arrangement example of electronic equipment according to some embodiments of the present invention.

FIGS. 11A and 11B are views schematically showing examples of the display apparatus according to this embodiment. FIG. 11A shows a display apparatus such as a television monitor or a PC monitor. A display apparatus 1100 includes a frame 1101 and a display unit 1102. The light-emitting apparatus according to this embodiment may be used for the display unit 1102.

The frame 1101 and a base 1103 that supports the display unit 1102 are provided. The base 1103 is not limited to the form shown in FIG. 11A. The lower side of the frame 1101 may serve as the base. The frame 1101 and the display unit 1102 may be bent. The curvature radius may be between 5,000 mm (inclusive) and 6,000 mm (inclusive).

FIG. 11B is a view schematically showing another example of the display apparatus according to this embodiment. A display apparatus 1110 shown in FIG. 11B is configured to be bendable, and is a so-called foldable display apparatus. The display apparatus 1110 includes a display unit 1111, a display unit 1112, a housing 1113, and a bending point 1114. Each of the display unit 1111 and the display unit 1112 may include the light-emitting apparatus according to this embodiment. The display unit 1111 and the display unit 1112 may be one seamless display apparatus. The display unit 1111 and the display unit 1112 can be divided at the bending point. The display unit 1111 and the display unit 1112 may display different images, or one image may be displayed with the display unit 1111 and the display unit 1112.

Figure 12A:
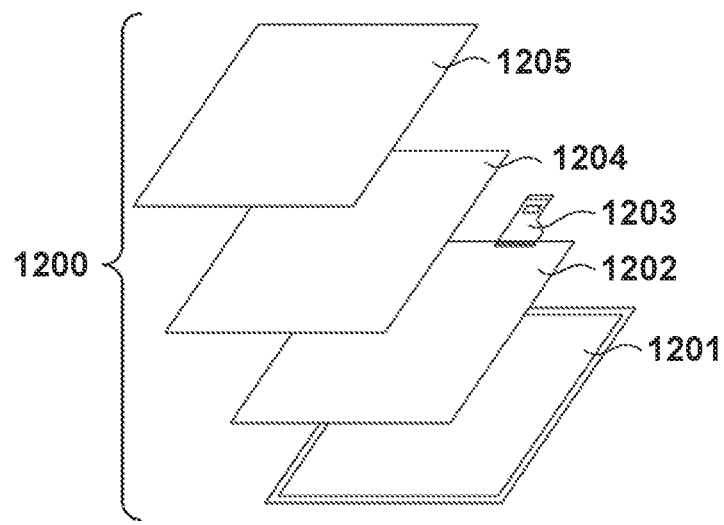
FIG. 12A is a view showing an arrangement example of an illumination apparatus according to some embodiment of the present invention.

FIG. 12A is a view schematically showing an example of an illumination apparatus according to this embodiment. An illumination apparatus 1200 may include a housing 1201, a light source 1202, a circuit board 1203, an optical film 1204, and a light diffusion unit 1205. The light source may include the light-emitting apparatus according to this embodiment. The optical film 1204 transmits light emitted from the light source 1202. The optical film 1204 may be a filter that improves the color rendering property of the light source. The light diffusion unit 1205 transmits light emitted from the light source 1202. The light diffusion unit 1205 can effectively diffuse light from the light source to illuminate a wide range for lighting up or the like. The optical film 1204 and the light diffusion unit 1205 may be provided on the illumination light emission side. A cover may be provided in the outermost portion, as needed.

The illumination apparatus 1200 is, for example, a apparatus that illuminates a room. The illumination apparatus 1200 may emit light of white, day white, or any other color from blue to red. The illumination apparatus 1200 may include a light control circuit for controlling the light color. The illumination apparatus 1200 may include the light-emitting apparatus according to the present invention and a power supply circuit connected thereto. The power supply circuit is a circuit that converts an AC voltage into a DC voltage. Note that white light has a color temperature of 4200K, and day-white light has a color temperature of 5000K. The illumination apparatus 1200 may include a color filter.

Further, the illumination apparatus according to this embodiment may include a heat dissipation portion. The heat dissipation portion releases the heat in the apparatus to the outside of the apparatus, and examples thereof include a metal having high specific heat, liquid silicon, and the like.

Figure 12B:
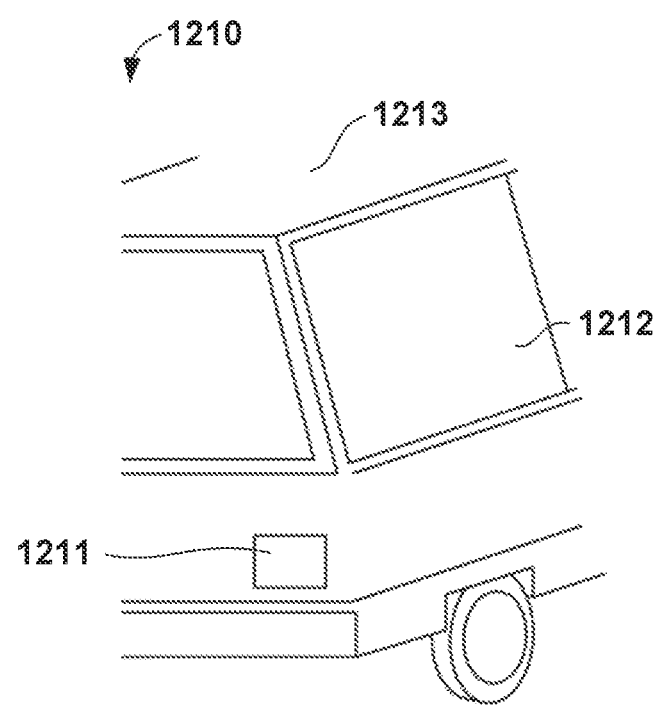
FIG. 12B is a view showing an arrangement example of a mobile body according to some embodiments of the present invention.

FIG. 12B is a view schematically showing an automobile which is an example of a mobile body according to this embodiment. The automobile includes a tail lamp which is an example of the lighting unit. An automobile 1210 includes a tail lamp 1211, and may turn on the tail lamp when a brake operation or the like is performed.

The tail lamp 1211 may include the light-emitting apparatus according to this embodiment. The tail lamp may include a protective member that protects the organic EL element. The protective member has a certain degree of strength, and can be made from any material as long as it is transparent. For example, the protective member may be made from polycarbonate or the like. Furandicarboxylic acid derivative, acrylonitrile derivative, or the like may be mixed with polycarbonate.

The automobile 1210 may include a body 1213 and windows 1212 attached thereto. The window 1212 may be a transparent display as long as it is not a window for checking the front or rear of the automobile 1210. The transparent display may include the light-emitting apparatus according to this embodiment. In this case, the components such as the electrodes included in the light-emitting apparatus are formed by transparent members.

The mobile body according to this embodiment may be a ship, an aircraft, a drone, or the like. The mobile body may include a body and a lighting unit provided in the body. The lighting unit may emit light to inform the position of the body. The lighting unit includes the light-emitting apparatus according to this embodiment.

The present invention is not limited to the above embodiments and various changes and modifications can be made within the spirit and scope of the present invention. Therefore, to apprise the public of the scope of the present invention, the following claims are made.

In the above-described embodiment, it is possible to improve the moisture resistance of the light-emitting apparatus without increasing the size of the light-emitting apparatus.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-163275, filed Sep. 6, 2019, which is hereby incorporated by reference herein in its entirety.

What is claimed is:

1. A light-emitting apparatus, comprising:
an insulating layer comprising a light-emitting region in which first and second light-emitting elements are arranged, the second light-emitting element being arranged in a first direction with respect to the first light-emitting element;
an organic layer arranged above the insulating layer and including a portion forming a part of the first light-emitting element and a part of the second light-emitting element; and
a protective layer arranged above the organic layer, wherein
the apparatus includes a groove in the insulating layer between the light-emitting region and an end of the insulating layer,
a maximum value of a length of a line segment whose ends are two points on edges of the groove is larger than a length of the light-emitting region in the first direction, and
D/Wg≥0.5 where Wg represents a maximum value of a length in plan view of a line segment whose ends are two points on the edges of the groove and that does not intersect with the edges of the groove, and D represents a depth of the groove.

2. The apparatus according to claim 1, wherein D/Wg≥0.8.

3. The apparatus according to claim 1, wherein the groove includes a portion extending in a zigzag shape or a portion comprising a wrapping pattern.

4. The apparatus according to claim 1, wherein the groove includes a plurality of circumferential grooves connected to each other.

5. The apparatus according to claim 1, wherein the groove includes a plurality of polygonal grooves connected to each other.

6. The apparatus according to claim 1, wherein a width of the groove at an upper end is smaller than a width of the groove at a lower end.

7. The apparatus according to claim 1, wherein the protective layer contains a silicon compound.

8. The apparatus according to claim 1, wherein the protective layer has a stacked structure of a first layer containing a silicon compound, and a second layer comprising at least one of $Al_2O_3$, $TiO_2$ and $SiO_2$.

9. The apparatus according to claim 1, wherein a part of the protective layer is within the groove, and
the organic layer is separated in the groove by the protective layer.

10. An electrophotographic printer, comprising:
a photoconductor; and
the light-emitting apparatus according to claim 1, said light-emitting apparatus being configured to apply light to the photoconductor.

11. A display apparatus comprising a plurality of pixels, wherein at least one of the plurality of pixels comprises a light-emitting element of the light-emitting apparatus according to claim 1, and a transistor connected to the light-emitting element.

12. A photoelectric conversion apparatus, comprising:
an optical unit including a plurality of lenses;
an image sensor configured to receive light passing through the optical unit; and
a display unit configured to display an image captured by the image sensor, wherein
the display unit comprises the light-emitting apparatus according to claim 1.

13. Electronic equipment comprising a display unit, comprising:
the light-emitting apparatus according to claim 1;
a housing provided with the display unit; and
a communication unit provided in the housing and configured to communicate with the outside.

14. An illumination apparatus comprising a light source including the light-emitting apparatus according to claim 1; and
one of a light diffusion unit and an optical film configured to transmit light emitted by the light source.

15. A mobile body comprising a lighting unit including the light-emitting apparatus according to claim 1; and
a body provided with the lighting unit.

16. A light-emitting apparatus, comprising:
an insulating layer comprising a light-emitting region including a light-emitting element; and
a groove provided in a portion of the insulating layer between the light-emitting region and an end of the insulating layer, wherein
D/Wg≥0.5 where Wg represents a maximum value of a length in plan view of a line segment whose ends are two points on edges of the groove and that does not intersect with the edges of the groove, and D represents a depth of the groove.

17. The apparatus according to claim 16, wherein the light-emitting element is a first light-emitting element,
the light-emitting region comprises a second light-emitting element arranged adjacent to the first light-emitting element in a first direction, and
a maximum value of a length of a line segment whose ends are two points on the edges of the groove is larger than a length of the light-emitting region in the first direction.

18. A light-emitting apparatus, comprising:
an insulating layer comprising a light-emitting region including a light-emitting element, the light-emitting region having a polygonal form in plan view; and
a groove provided in a portion of the insulating layer between the light-emitting region and an end of the insulating layer, the groove having a zigzag in plan view.

19. The apparatus according to claim 18, wherein the zigzag and wrapping pattern are with respect to a surface of the insulating layer including the light-emitting region.

20. The light-emitting apparatus according to claim 18, wherein the zigzag of the groove extends along one side of the light-emitting region having the polygonal form.

21. The light-emitting apparatus according to claim 18, wherein the zigzag includes alternate right and left turns.

* * * * *